US009966225B2

(12) United States Patent
Bizen et al.

(10) Patent No.: US 9,966,225 B2
(45) Date of Patent: May 8, 2018

(54) CHARGED PARTICLE BEAM DEVICE, SIMULATION METHOD, AND SIMULATION DEVICE

(71) Applicant: HITACHI, LTD., Chiyoda-ku, Tokyo (JP)

(72) Inventors: Daisuke Bizen, Tokyo (JP); Makoto Sakakibara, Tokyo (JP); Hiroya Ohta, Tokyo (JP); Junichi Tanaka, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days. days.

(21) Appl. No.: 15/329,638

(22) PCT Filed: Jul. 28, 2014

(86) PCT No.: PCT/JP2014/069815
§ 371 (c)(1),
(2) Date: Jan. 27, 2017

(87) PCT Pub. No.: WO2016/016927
PCT Pub. Date: Feb. 4, 2016

(65) Prior Publication Data
US 2017/0213695 A1    Jul. 27, 2017

(51) Int. Cl.
*H01J 37/24* (2006.01)
*H01J 37/244* (2006.01)
*H01J 37/26* (2006.01)

(52) U.S. Cl.
CPC ............ *H01J 37/244* (2013.01); *H01J 37/24* (2013.01); *H01J 37/261* (2013.01); *H01J 2237/221* (2013.01); *H01J 2237/226* (2013.01)

(58) Field of Classification Search
CPC ........ H01J 37/244; H01J 37/24; H01J 37/261; H01J 2237/226; H01J 2237/221
USPC ................................ 250/306, 307, 310, 311
See application file for complete search history.

(56) References Cited

U.S. PATENT DOCUMENTS

2012/0126116 A1* 5/2012 Tanaka ................... G01B 15/04
                                                                    250/307
2013/0200255 A1   8/2013 Schwarzband et al.

FOREIGN PATENT DOCUMENTS

| JP | 05-275045 | A |   | 10/1993 |
|----|-----------|---|---|---------|
| JP | 2010-129516 | A |   | 6/2010 |
| JP | 2010129516 | A | * | 6/2010 |
| JP | 2010-205864 | A |   | 9/2010 |

(Continued)

*Primary Examiner* — Michael Maskell
(74) *Attorney, Agent, or Firm* — Miles & Stockbridge P.C.

(57) ABSTRACT

A simulation device calculates a detection number of electrons generated by charged particles radiated to a sample by a simulation and generates a simulation image of the sample. The simulation device holds penetration length information (272) in which incidence conditions of the charged particles and a penetration length are associated with each other, sample configuration information (271) which shows a configuration of a sample, and emission electron number information in which the incidence conditions of the charged particles and an emission electron number are associated with each other. The simulation device calculates the number of electrons emitted from a predetermined incidence point, on the basis of incidence conditions at the predetermined incidence point, the penetration length information (272), the sample configuration information (271), and the emission electron number information.

13 Claims, 12 Drawing Sheets

(56) References Cited

FOREIGN PATENT DOCUMENTS

| JP | 2010205864 A | * | 9/2010 |
|---|---|---|---|
| JP | 2011-033423 A | | 2/2011 |
| JP | 2011-186044 A | | 9/2011 |
| JP | 2012-178236 A | | 9/2012 |
| JP | 2013-161795 A | | 8/2013 |
| JP | 2013-178143 A | | 9/2013 |

* cited by examiner

| $E\_i = \bigcirc\bigcirc keV$ | | $\theta\_i$ | | |
|---|---|---|---|---|
| | | 0 ··· | 60 ··· | 90 |
| $\theta\_SE$ | 0 | Y_00 ··· | Y_06 ··· | Y_09 |
| | 10 | Y_10 ··· | Y_16 ··· | Y_19 |
| | 20 | Y_20 ··· | Y_26 ··· | Y_29 |
| | ⋮ | ⋮ | ⋮ | ⋮ |
| | 90 | Y_n0 ··· | Y_n6 ··· | Y_n9 |

E_i : PRIMARY ELECTRON ENERGY
$\theta\_i$ : PRIMARY ELECTRON INCIDENCE ANGLE
$\theta\_SE$ : SECONDARY ELECTRON EMISSION ANGLE
Y : EMISSION NUMBER

SECONDARY ELECTRON ANGLE DISTRIBUTION INFORMATION 273

|  |  | θ_i1 |  |  |  |  |
|---|---|---|---|---|---|---|
|  |  | 0 | 10 | 20 | ... | 90 |
| E_SE | 0 | M_00 | M_01 | M_02 | ... | M_09 |
|  | 1 | M_10 | M_11 | M_12 | ... | M_19 |
|  | 2 | M_20 | M_21 | M_22 | ... | M_29 |
|  | . |  |  |  |  |  |
|  | . |  |  |  |  |  |
|  | n | M_n0 | M_n1 | M_n2 | ... | M_n9 |

θ_i1 : SECONDARY ELECTRON INCIDENCE ANGLE
E_SE : SECONDARY ELECTRON ENERGY
M : REFLECTANCE

REFLECTANCE INFORMATION  275

CHARGED PARTICLE BEAM DEVICE, SIMULATION METHOD, AND SIMULATION DEVICE

TECHNICAL FIELD

The present invention relates to a charged particle beam device, a simulation method, and a simulation device.

BACKGROUND ART

As a background art of the present technical field, there is PTL 1. PTL 1 discloses that an electromagnetic field distribution EM of an electronic optical system 4 in an electron microscope body 1 is calculated and detection values of first emission electrons 50 from a sample 5 in the electromagnetic field distribution EM and second emission electrons 52 emitted from the electronic optical system by collision of the first emission electrons are calculated by a Monte Carlo method. In addition, PTL 1 describes that, if detection values are acquired for every incidence position of electron beams 2 for the sample 5, SEM images according to the detection values are generated, and a desired image is selected and designated from the SEM images, the electronic optical system is set to a simulated condition and such an SEM image can be actually observed.

As another background art of the present technical field, there is PTL 2. PTL 2 describes that an image forming apparatus that acquires information of a region including a radiation range of charged particle beams from design data of a semiconductor device, calculates an amount of electrons detected at a pixel portion when the charge particle beams are radiated to the sample, in a pixel unit for the radiation range of the charged particle beams, on the basis of the information, arranges brightness information acquired on the basis of the number of electrons, and forms an image is suggested.

CITATION LIST

Patent Literature

PTL 1: JP 2010-129516 A
PTL 2: JP 2010-205864 A

SUMMARY OF INVENTION

Technical Problem

As represented by PTL 1, the Monte Carlo method takes very long calculation time to calculate scattering of electrons repeatedly. Typically, several hours to several days are needed to obtain one scanning image. Therefore, as disclosed in PTL 1, if multiple SEM images are simulated under different radiation conditions of primary electrons using the Monte Carlo method, time needed for the simulation increases drastically to estimate an optimal radiation condition. As a result, convenience of the simulation may be lost.

In addition, secondary electrons detected in a scanning electron microscope (SEM) are classified into true secondary electrons and reflected electrons. The true secondary electrons are electrons that are generated when primary electron beams are scattered inelastically in the sample and excite atoms in the sample and are emitted from a surface. The true secondary electrons have electron energy of 50 eV or less. The reflected electrons are electrons that escape from the surface after the primary electrons are scattered backward in the sample. The reflected electrons have almost the same energy as the primary electrons. Generally, in the scanning electron microscope, because the true secondary electrons are mainly detected and the scanning image is obtained, simulation precision of the true secondary electrons is important even in the simulation.

However, in a low energy region of 50 eV or less, an inelastic mean free path of electrons becomes different greatly in a theoretical value and an experimental value and calculation precision of the true secondary electrons by the Monte Carlo method may be lowered.

Meanwhile, as a simulation method of scanning image generation not using the Monte Carlo method, there is a method of calculating emission of electrons by a secondary electron number, energy, and an angle, as disclosed in PTL 2.

However, in the method disclosed in PTL 2, there is no mention of accurately simulating true secondary electron emission numbers of an edge of an uneven portion and a joining surface of different kinds of materials. In addition, for the number of secondary electrons generated, the energy, and the angle, values known in documents are used as parameters and reflectance of the secondary electron or a penetration length of the primary electron at a sidewall is not considered. For example, a measurement device based on the scanning electron microscope measures a dimension of a pattern using the phenomenon (edge effect) of the true secondary electron emission number increasing at an edge of the sample. Therefore, it is important to accurately simulate the true secondary electron emission number at the edge of the sample.

Solution to Problem

According to a representative example of the present invention, there is a simulation device that calculates a detection number of electrons generated by charged particles radiated to a sample by a simulation and generates a simulation image of the sample. Penetration length information in which incidence conditions of the charged particles and a penetration length are associated with each other, sample configuration information showing a configuration of the sample, and emission electron number information in which the incidence conditions of the charged particles and an emission electron number are associated with each other are held and the number of electrons emitted from a predetermined incidence point is calculated on the basis of incidence conditions at the predetermined incidence point, the penetration length information, the sample configuration information, and the emission electron number information.

Advantageous Effects of Invention

According to an aspect of the prevent invention, formation of a scanning image of a sample including a region of a different configuration by a charged particle beam can be appropriately simulated while calculation time is shortened.

DESCRIPTION OF EMBODIMENTS

Figure 1:
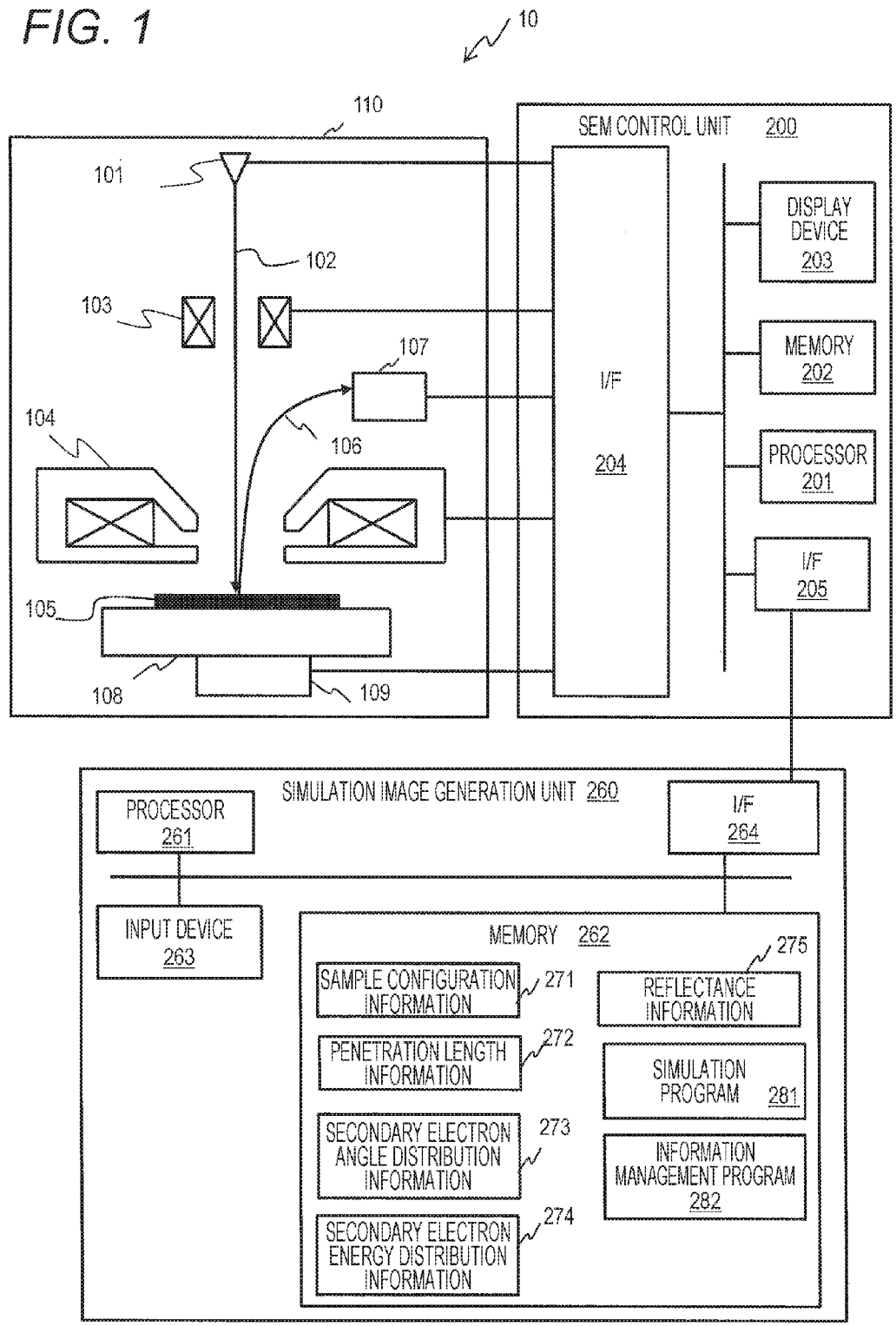
FIG. 1 schematically illustrates a configuration example of a scanning electron microscope.

Hereinafter, embodiments of the present invention will be described with reference to the accompanying drawings. It should be noted that this embodiment is only an example to realize the present invention and does not limit a technical range of the present invention. In the individual drawings, common configurations are denoted with the same reference numerals.

This embodiment relates to a simulation of a charged particle beam device. Observation objects of the charged particle beam device such as a scanning electron microscope (SEM) are wide from a semiconductor device to a high functional material and a biological sample. For example, in a field of a semiconductor, a measurement device (hereinafter, referred to as an SEM-type length measurement device) based on the scanning electron electroscope comes into wide use to measure a dimension of a circuit pattern formed on a wafer in the middle of a process on a manufacturing line. The SEM-type length measurement device plays an important role in improving a yield of the semiconductor device.

The scanning electron microscope scans a sample with primary electron beams and detects secondary electrons generated by radiation of the primary electron beams, thereby obtaining a scanning image of the sample. Because an obtained scanning image is also changed by a radiation condition of the primary electron beams, specifically, incidence energy or a current amount, it is necessary to optimize the radiation condition of the primary electron beams to obtain a desired scanning image.

However, if the primary electron beams are radiated to the sample, the sample is damaged. For this reason, it is preferable to optimize a radiation condition without radiating the primary electron beams to the sample. To that end, it is necessary to accurately simulate the number of secondary electrons emitted from the sample. Here, the secondary electrons include true secondary electrons and reflected electrons.

As a method of simulating the number of secondary electrons emitted from the sample, a calculation method using a Monte Carlo method is generally known. This method reproduces the secondary electrons generated by the primary electron beams incident on the sample, using the scattering probability, a mean free path, and a random number, and performs repetitive calculation, and acquires the number of secondary electrons emitted, energy thereof, and an emission angle thereof.

However, in a model of the present Monte Carlo method, it is difficult to accurately simulate reflectance of true secondary electrons to be electrons of low energy of 50 eV or less. In a low energy region, an inelastic mean free path of electrons becomes different greatly in a theoretical value and an experimental value and calculation precision is lowered. In addition, a simulation using the Monte Carlo method takes long time to obtain one scanning image.

In addition, samples having uneven portions (three-dimensional shapes) on surfaces and samples made of a plurality of different kinds of materials exist. In these samples, it is demanded to accurately simulate a secondary electron emission number of an edge of the uneven portion and a joining surface of the different kinds of materials.

When the sample having the three-dimensional shape is simulated, secondary electrons emitted from a bottom of a groove or a hole may be incident again on a sidewall. The secondary electrons are partially reflected on the surface of the sample and are partially absorbed. Therefore, it is necessary to accurately acquire reflectance of the secondary electrons at the sidewall to improve calculation precision.

The charged particle beam device according to this embodiment holds penetration length information in which incidence conditions of charged particles and a penetration length are associated with each other, sample configuration information, and emission electron number information in which the incidence conditions of the charged particles and an emission electron number are associated with each other.

In a simulation of scanning image generation, the charged particle beam device determines a penetration region of the charged particles on the basis of the incidence conditions of the charged particles and the penetration length information and specifies a sample configuration in the penetration region on the basis of the sample configuration information. The charged particle beam device calculates the number of electrons emitted by the charged particles, on the basis of the incidence conditions of the charged particles, the sample configuration in the penetration region, and the emission electron number information. As a result, an electron emission number in the sample including regions having different configurations can be appropriately calculated.

The incidence conditions of the charged particles are determined by the radiation conditions of the charged particles and the configuration of the sample on which the charged particles are incident. The radiation conditions of the charged particles are conditions independent from the sample and include at least one of energy and a radiation direction of the charged particles. The incidence conditions of the charged particles include at least one of energy of the charged particles, an incidence angle thereof, and a sample material at an incidence point thereof. The configuration of the sample is a broader term including a shape and a material of the sample. Specifically, the charged particle beam device specifies a surface shape and/or a material of the sample in the penetration region.

An element of the incidence conditions referred to at the time of determining the penetration region and an element of the incidence conditions referred to at the time of calculating the emission electron number may be different from each other. For example, the incidence conditions referred to at the time of determining the penetration region may include the charged particle energy and the sample material and the incidence conditions referred to at the time of calculating the electron emission number may include the charged particle energy, the incidence angle, and the sample material.

In this embodiment, scattering of the emission electrons in the sample does not need to be calculated thoroughly like the Monte Carlo calculation. Therefore, a high-speed and high-precision simulation of the emission number of electrons generated by the sample can be realized. Because the emission number of electrons is calculated on the basis of the sample configuration in the penetration region, the electron emission number in the edge of the uneven shape or the joining surface of the different kinds of materials can be accurately simulated at a high speed.

In one example, the emission electron number information includes angle distribution information showing a relation of incidence conditions and an emission angle distribution of electrons and energy distribution information showing a relation of the incidence conditions and an energy distribution of emission electrons. The charged particle beam device determines an emission angle distribution and an emission energy distribution of the emission electrons, on the basis of the incidence conditions, the sample configuration in the penetration region, and the emission electron number information.

The emission electron number information may include only information necessary for the simulation of the sample. The emission electron number information may show a relation of the incidence conditions and the emission number and may not show the emission angle distribution or the emission energy distribution. The incidence conditions may not include a part of elements of the incidence energy, the incidence angle, and the sample configuration.

The charged particle beam device considers reflection of the electrons generated by the charged particle beams on the sample, in the simulation of the scanning image generation. The charged particle beam device previously has reflectance information showing a relation of the incidence conditions and the reflectance of the secondary electrons. The charged particle beam device calculates presence and absence of reflection of the electrons by the uneven shape of the sample surface and the reflectance, from the emission angle distribution of the electrons, the emission energy distribution of the electrons, and the sample configuration information. As a result, a more accurate simulation image of the sample having the surface of the uneven shape can be obtained.

In one example, the charged particle beam device automatically determines radiation conditions in actual scanning image formation of the sample, on the basis of the simulation image. The charged particle beam device is set to appropriate radiation conditions by the simulation of the scanning image formation. The charged particle beam device may adopt only one of emission of the secondary electrons based on the configuration in the penetration region and reflection of the secondary electrons by the sample. The radiation conditions may be set by a user who has confirmed the simulation image.

First Embodiment

A scanning electron microscope (SEM) will be described as an example of a charged particle beam device. FIG. 1 schematically illustrates a configuration example of a scanning electron microscope 10. The scanning electron microscope 10 radiates primary electron beams 102 from an electron source 101 to a sample 105 in a chamber 110. After the sample 105 is disposed on a sample stage 108 in the chamber 110, air in the chamber 110 is exhausted by a pump not illustrated in the drawings and the chamber 110 is maintained in a vacuum state.

The sample stage 108 is fixed on a movement mechanism 109. The movement mechanism 109 can move the sample stage 108 in a normal direction of a stage surface and any direction in the surface. In addition, the movement mechanism 109 can change an inclination angle for the primary electrons 102, in addition to rotating the sample stage 108.

The electron source 101 generates the primary electrons 102 and outputs the primary electrons 102. The primary electrons 102 generated by the electron source 101 are converged by an objective lens 104 and is incident on the sample 105. A deflector 103 controls an advancement direction of the primary electrons 102. The deflector 103 moves a radiation position to the sample 105 and scans the sample 105.

A detector 107 detects secondary electrons 106 generated by incidence of the primary electrons 102 on the sample 105. In the following description, the secondary electrons 106 include true secondary electrons of which energy is equal to or less than 50 eV and reflected electrons of which energy is more than 50 eV, unless otherwise stated.

An SEM control unit 200 generates image data from a detection signal of the detector 107 and controls components in the chamber 110. In one example, the SEM control unit 200 has a general calculator configuration. Specifically, the SEM control unit 200 includes a processor 201, a memory 202, a display device 203, and interfaces (I/F) 204 and 205.

The SEM control unit 200 exchanges data with the components in the chamber 110 via the I/F 204 and exchanges data with a simulation image generation unit 260 via the I/F 205.

The processor 201 operates according to a program stored in the memory 202 and realizes a function of the SEM control unit 200. The processor 201 generates image data from a signal from the detector 107 and displays a scanning image on the display device 203.

The processor 201 controls the individual units in the chamber 110 according to a user input using the input device 263. The processor 201 controls the movement mechanism 109 of the sample stage 108 and adjusts a position and a posture of the sample 105. The processor 201 controls the electron source 101. The processor 201 controls the electron source 101 and controls energy or a current of the primary electrons 102.

The processor 201 controls the deflector 103 and moves a scanning spot position of the primary electrons 102 on the sample 105. The processor 201 controls the objective lens 104 and focuses the objective lens 104 on the primary electrons 102.

As described above, the scanning electron microscope 10 detects the secondary electrons 106 by the detector 107 and forms a scanning image. Therefore, simulation precision of secondary electron emission is most important in a simulation of scanning image generation.

The simulation image generation unit 160 simulates generation of the scanning image by the scanning electron microscope 10. In one example, the simulation image generation unit 160 has a general calculator configuration. The simulation image generation unit 160 may include one or more calculators. At least apart of functions realized by programs to be described below may be mounted by a dedicated circuit.

In an example of FIG. 1, the simulation image generation unit 260 includes a processor 261, a memory 262, an input device 263, and an I/F 264. The simulation image generation unit 260 exchanges data with the SEM control unit 200 via the I/F 264.

A user inputs a command and information from the input device 163 and operates the scanning electron microscope 10. The user inputs information necessary for the simulation from the input device 163 and commands execution of the simulation. Simulation image data generated by the simulation is transmitted to the SEM control unit 200 and the display device 203 displays a simulation image.

In addition, the user inputs observation condition information such as radiation conditions of the primary electron beams in actual scanning image generation of the sample 105 and a sample angle from the input device 263 and commands generation of the scanning image.

The processor 261 operates according to a program stored in the memory 262. Each of the processor 261 and the memory 262 includes one or more chips. In the example of FIG. 1, the memory 262 stores a simulation program 281, an information management program 282, and an information correction program 283. Further, the memory 262 stores sample configuration information 271, penetration length information 272, secondary electron angle distribution information 273, secondary electron energy distribution information 274, and reflectance information 275.

The information management program 282 manages information stored in the memory 262. The information stored in the memory 262 may be previously stored in a device maker and may be input by the user. The user can add and correct the information stored in the memory 262. The information management program 282 updates the information stored in the memory 262 with information input from the input device 263. The information correction program 283 executes correction of the information stored in the memory 262.

The simulation program 281 executes the simulation of the scanning image generation on the basis of the primary electron radiation conditions and the sample configuration information and generates simulation image data. The simulation program 281 transmits the simulation image data to the display device 203 and the display device 203 displays a simulation image.

For example, the user inputs the configuration of the observation sample and the primary electron radiation conditions from the input device 263. The simulation program 281 executes the simulation on the basis of input information and previously held information. The user can obtain a simulation image of the objection sample without actually radiating the primary electrons 102 to the sample 105.

In addition, the user confirms a plurality of simulation images under different primary electron radiation conditions, so that the user can estimate a primary electron radiation condition where desired contrast is obtained, before actual observation of the sample 105. As described above, the user can view the simulation images formed under the different primary electron radiation conditions on the display device 203.

In one example, if the user selects one simulation image in the display device 203, the simulation program 281 transmits information of the primary electron radiation conditions referred to at the time of generating the simulation image to the SEM control unit 200. The SEM control unit 200 sets the designated primary electron radiation conditions to the electron source 101.

Figure 2:
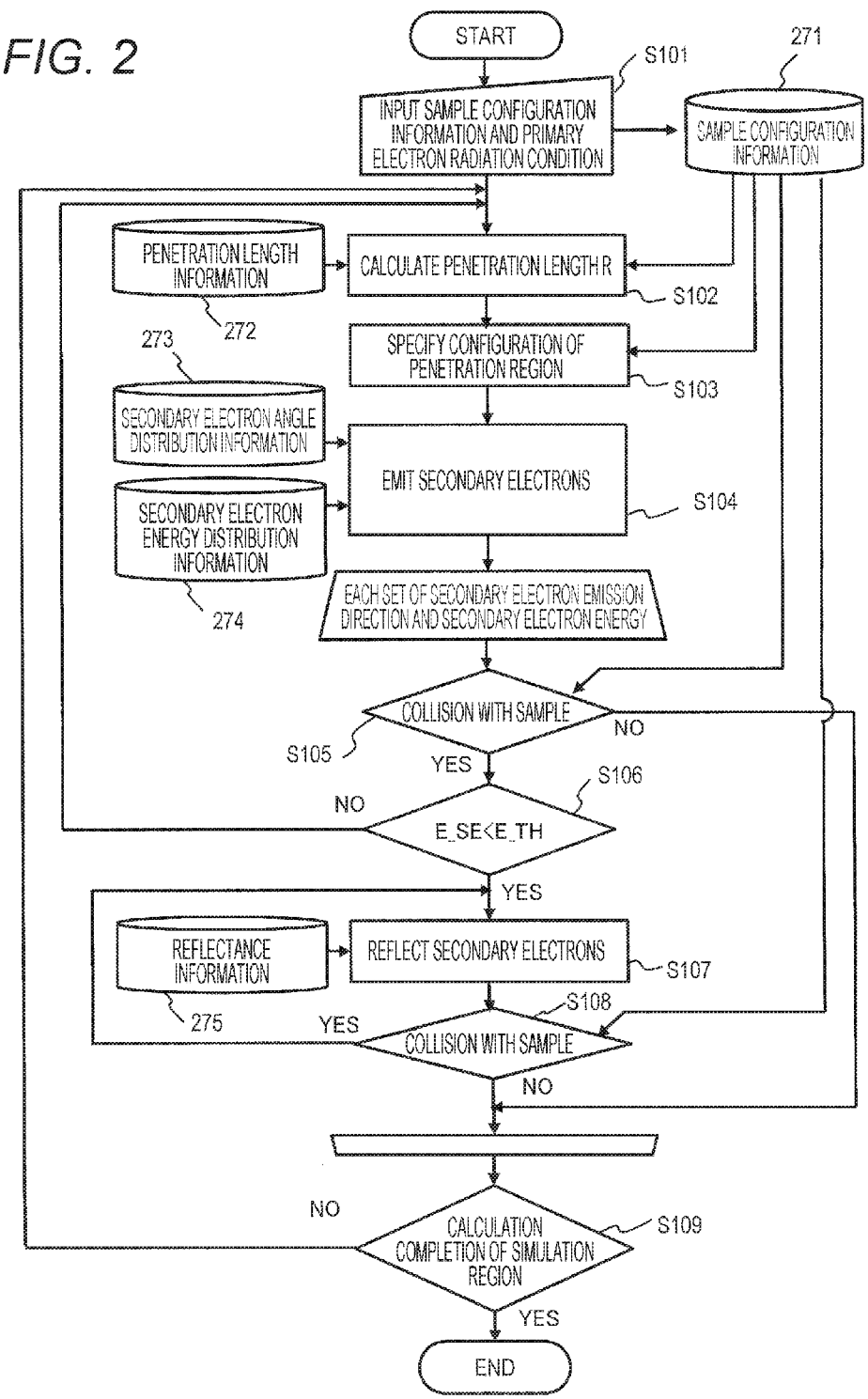
FIG. 2 illustrates a flowchart of a simulation of scanning image generation by a simulation image generation unit.

FIG. 2 illustrates a flowchart of a simulation of scanning image generation by the simulation image generation unit 160. A configuration of the sample 105, an operation of the scanning electron microscope 10, and behavior of the primary electrons 102 and the secondary electrons 106 to be described below are based on the simulation by the simulation image generation unit 160.

In step S101, the user inputs configuration information of a virtual sample 105 (hereinafter, also referred to as the sample) to be a simulation object, primary electron radiation conditions, and a simulation region from the input device 263. The information management program 282 stores the input configuration information of the sample 105 in the sample configuration information 271. The primary electron radiation conditions and the simulation region are stored in the memory 262 and are used by the simulation program 281.

The configuration information of the sample 105 includes three-dimensional information for a shape and a material of the sample 105. The primary electron radiation conditions include energy of the primary electrons 102 and an incidence angle of the primary electrons 102 on a reference surface of the sample 105. The simulation region is a region to form a simulation image in the sample 105 and the simulation program 281 calculates the secondary electrons 106 from each primary electron radiation point (incidence point) in the simulation region.

In step S102, the simulation program 281 selects one primary electron incidence point in the simulation region and calculates a penetration length R of the primary electrons 102 radiated to the primary electron incidence point. A region defined by the incidence point and the penetration length R is the penetration region.

Figure 3:
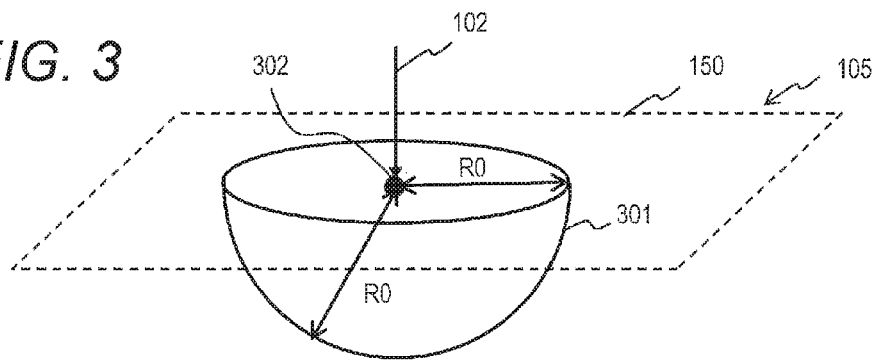
FIG. 3 schematically illustrates a penetration region.

FIG. 3 schematically illustrates a penetration region 301. In FIG. 3, the primary electron 102 is incident on a sample surface 150 at an incidence point 302. A penetration length is R0. The penetration region 301 is a region of the sample 105 that is included in a sphere of a radius R0 with the incidence point 302 as a center.

The simulation program 281 calculates the penetration length R0, on the basis of the penetration length information 272, the radiation condition of the primary electron 102, and the configuration information of the sample 105 in the sample configuration information 271. The penetration length information 272 shows a relation of each of a plurality of sample materials and each of a plurality of incidence energy values, for example.

The penetration length information 272 may be configured on the basis of an actual measurement value. For example, the penetration length information 272 may be configured on the basis of a theoretical formula such as a Kanaya's formula represented by the following formula (1). The penetration length information 272 may follow the theoretical formula.

[Math. 1]

$$R = \frac{27.6AE_i^{1.67}}{\rho Z^{8/9}} \quad (1)$$

In the formula (1), R shows a penetration length (nm), E_i shows incidence energy (keV) of the primary electron 102, A shows an atom amount of the sample 105, ρ shows a density (g/cm³) of the sample 105, and Z shows an atom number of the sample of the sample 105.

Formula (1) shows the penetration length for the incidence condition of the primary electron 102. The simulation program 281 determines the incidence conditions from the primary electron radiation conditions and the sample configuration information 271. For example, the simulation program 281 acquires the atom amount A of the sample 105 at the incidence point 302, the density of the sample 105 at the incidence point 302, and the atom number of the sample 105 at the incidence point 302, from the sample configuration information 271. The simulation program 281 calculates a penetration length R0 from the incidence conditions including the information acquired from the sample configuration information 271 and the incidence energy value and the penetration length information 272. As a result, the penetration length can be calculated appropriately and easily.

The penetration region 301 may not be the sphere. For example, the simulation program 281 may determine the penetration region 301 on the basis of the incidence angle of the primary electron at the incidence point 302. For example, the penetration length information 272 shows a relation of a difference of the incidence angle and the penetration angle on the sample 105 and the penetration length. The simulation program 281 may consider a material and a length of each of passage regions of the primary electrons, in calculation of the penetration length from the incidence point 302 in each direction.

In step S103, the simulation program 281 specifies a configuration of the penetration region 301. The simulation program 281 determines presence and absence of a configuration change in the penetration region 301 and specifies each of different configuration portions in the penetration region 301. Specifically, the simulation program 281 specifies each of regions of different sample shapes or different sample materials in the penetration region by referring to the sample configuration information 271.

Figure 4A:
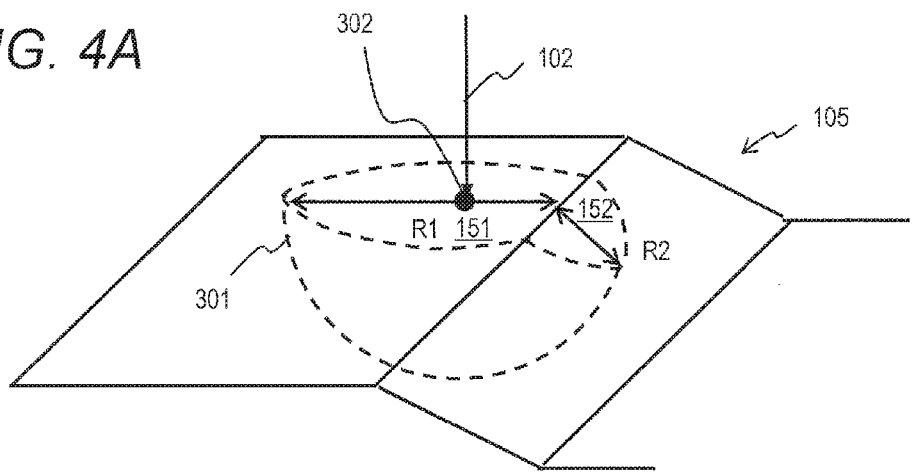
FIG. 4A illustrates an example of a penetration region including a region having a different configuration.
Figure 4B:
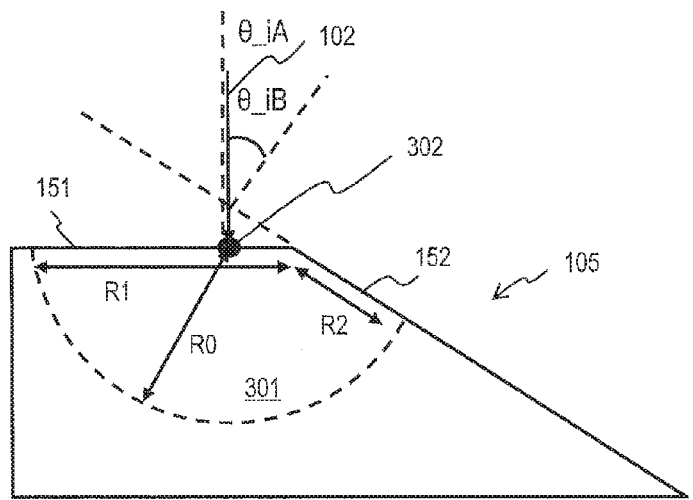
FIG. 4B is a cross-sectional view of FIG. 4A.

FIGS. 4A and 4B illustrate an example of the penetration region 301 including regions having different configurations. FIG. 4B is a cross-sectional view of FIG. 4A. In this example, the penetration region 301 includes a region having surface regions (partial regions) 151 and 152 where normal directions are different. The penetration region 301 has a shape change. The penetration region 301 is configured using the same material.

In this example, on a straight line passing through the incidence point 302, a length of the surface region 151 is R1 and a length of the surface region 152 is R2. The straight line is a straight line having a smallest ratio of R1 and R2 among straight lines passing through the incidence point 302.

The primary electron 102 is incident on the surface region 151 and an incidence angle thereof is θ_iA. An incidence angle when the primary electron 102 is incident on the surface region 152 is θ_iB. An incidence angle of the primary electron 102 on the sample surface is an angle between a normal of the sample surface and a radiation direction of the primary electron 102.

Figure 5A:
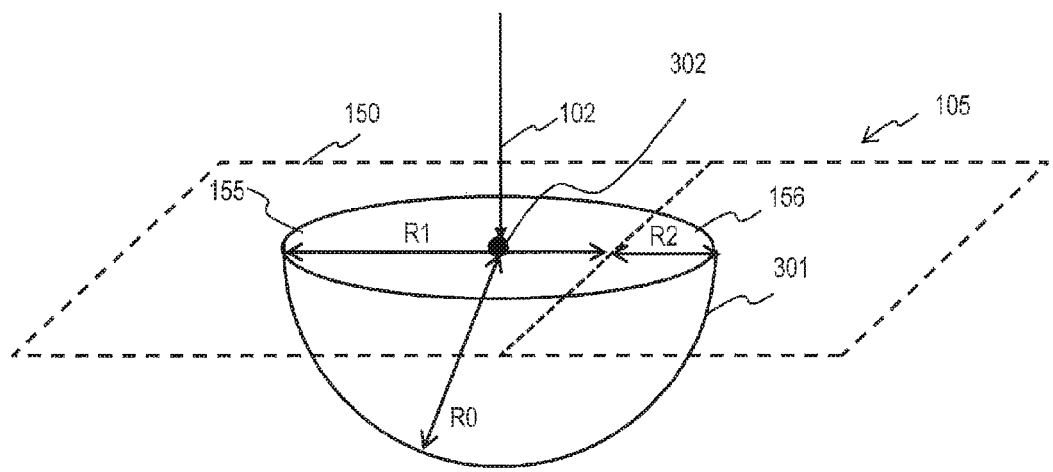
FIG. 5A illustrates an example of a penetration region including a region having a different configuration.
Figure 5B:
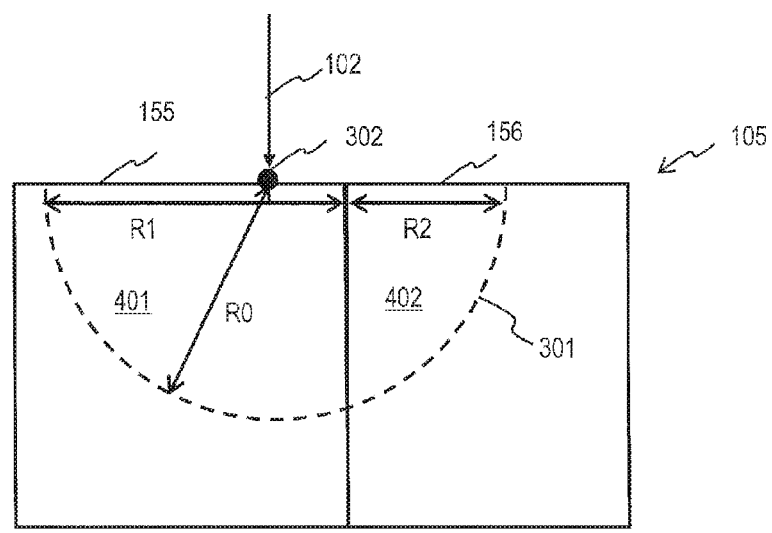
FIG. 5B is a cross-sectional view of FIG. 5A.

FIGS. 5A and 5B illustrate an example of the penetration region 301 including regions having different configurations. FIG. 5B is a cross-sectional view of FIG. 5A. The penetration region 301 has a material change. In this example, the penetration region 301 includes regions (partial regions) 401 and 402 where materials are different. The regions 401 and 402 have surface regions (partial regions) 155 and 156, respectively.

In this example, on a virtual line passing through the incidence point 302 of the surface region, a length of the surface region 155 is R1 and a length of the surface region 156 is R2. The incidence point 302 is included in the surface region 155. The surface regions 155 and 156 are flat and the incidence angle of the primary electron 102 is the same.

In step S104, the simulation program 281 calculates the secondary electron 106 emitted from the incidence point 302 of the primary electron 102 on the sample 105. The simulation program 281 refers to the secondary electron angle distribution information 273 and the secondary electron energy distribution information 274 and calculates secondary electron emission from the configuration of the penetration region 301. The secondary electron angle distribution information 273 shows dependency of the secondary electron emission number for the secondary electron emission angle. The secondary electron energy distribution information 274 shows dependency of the secondary electron emission number for the secondary electron energy.

Figures 6A, 6B:
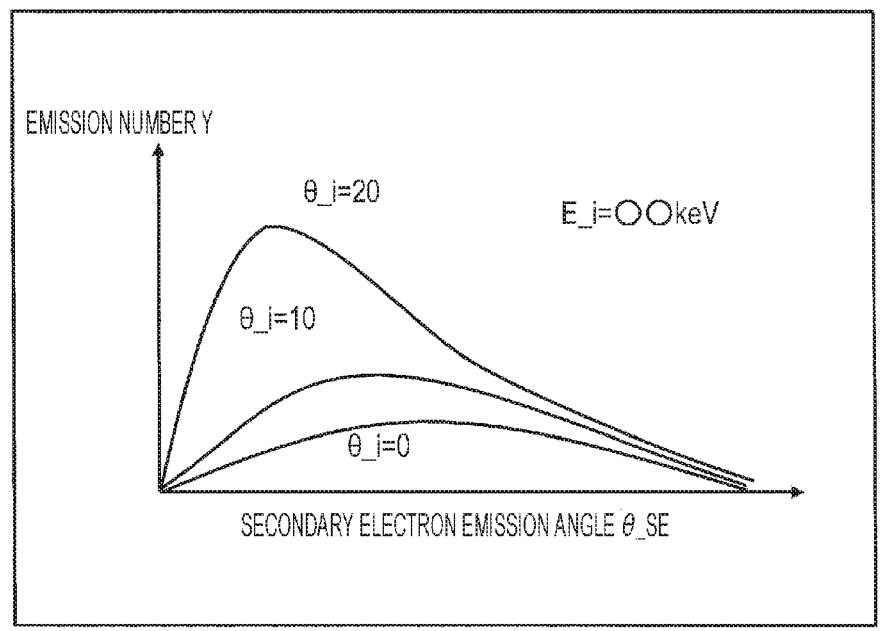
FIG. 6A illustrates an example of partial information included in secondary electron angle distribution information.
FIG. 6B shows a graph schematically illustrating a relation of a secondary electron emission angle θ_SE and a secondary electron emission number Y at a different incidence angle.

FIG. 6A illustrates an example of partial information included in the secondary electron angle distribution information 273. FIG. 6A illustrates a relation of a primary electron incidence angle θ_i, a secondary electron emission number Y, and a secondary electron emission angle θ_SE in a specific kind of sample material and specific primary electron energy E_i. FIG. 6B schematically illustrates a relation of a secondary electron emission angle θ_SE and a secondary electron emission number Y at a different incidence angle. A graph of FIG. 6B corresponds to a table of FIG. 6A.

In FIG. 6A, the secondary electron emission number Y shows an emission number for a unit amount of the primary electrons. In addition, the secondary electron emission number Y at each emission angle for the normal direction is the same for each angle φ in a plane vertical to the normal of the incidence point 302. For example, the emission number is defined in units of 10° of the in-plane emission angle φ. A relation of the angle φ and the secondary electron emission number is the same in the secondary electron angle distribution information 273 and the secondary electron energy distribution information 274.

For example, an amount of secondary electrons emitted at an emission angle 20° by a primary electron of which a primary electron incidence angle is 60° is Y_26. A total amount of secondary electrons emitted by a primary electron of which a primary electron incidence angle is 60° is a total sum of Y_06 to Y_n6.

The secondary electron angle distribution information 273 has the same table as the table illustrated in FIG. 6A for a different sample material and different primary electron incidence energy. The secondary electron angle distribution information 273 shows a secondary electron emission number at each of emission angles of secondary electrons at different incidence conditions. The incidence conditions include a sample material, incidence energy, and an incidence angle. As a result, a simulation of a sample having a complex configuration can be appropriately performed. The secondary electron angle distribution information 273 may include a function showing the same information, instead of at least a partial table.

Figures 7A, 7B:
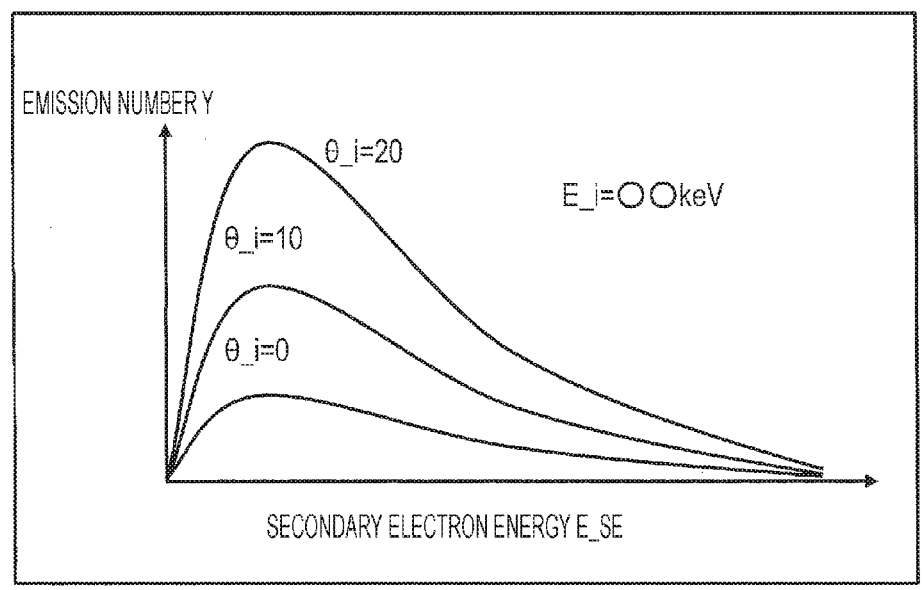
FIG. 7A illustrates an example of partial information included in secondary electron energy distribution information.
FIG. 7B shows a graph schematically illustrating a relation of secondary electron energy E_SE and a secondary electron emission number Y at a different incidence angle.

FIG. 7A illustrates an example of partial information included in the secondary electron energy distribution information 274. FIG. 7A illustrates a relation of a primary electron incidence angle $\theta\_i$, a secondary electron emission number Y, and secondary electron energy $E\_SE$ in a specific kind of sample material and specific primary electron energy $E\_i$. FIG. 7B is a graph schematically illustrating a relation of secondary electron energy $E\_SE$ and a secondary electron emission number Y at a different incidence angle. A graph of FIG. 7B corresponds to a table of FIG. 7A.

In FIG. 7A, the secondary electron emission number Y shows an emission number for a unit amount of the primary electrons. For example, an amount of secondary electrons having secondary electron energy of 2 eV by a primary electron of which a primary electron incidence angle is 60° is $Y\_26$. A total amount of secondary electrons emitted by a primary electron of which a primary electron incidence angle is 60° is a total sum of $Y\_06$ to $Y\_n6$. In FIGS. 6A and 7A, the secondary electron emission number is denoted with the reference numeral and the secondary electron emission number of the same reference numeral does not mean the same numerical value.

The secondary electron energy distribution information 274 has a table having the same configuration as the configuration of the table illustrated in FIG. 7A for a different sample material and different primary electron incidence energy. The secondary electron energy distribution information 274 shows a secondary electron emission number at each of energies of secondary electrons at different incidence conditions. The incidence conditions include a sample material, incidence energy, and an incidence angle. As a result, a simulation of a sample having a complex configuration can be appropriately performed. The secondary electron energy distribution information 274 may include a function showing the same information, instead of at least a partial table.

A calculation method of secondary electron emission by the simulation program 281 will be described. By the primary electron 102, the secondary electron 106 is emitted from the incidence point 302 of the primary electron 102. First, as illustrated in FIG. 3, the case in which the penetration region 301 does not have a configuration change, that is, the case in which the penetration region 301 is configured using the same material and a surface thereof is flat will be described.

The simulation program 281 acquires information corresponding to primary electron incidence energy and a sample material at the incidence point 302 from the secondary electron angle distribution information 273. The simulation program 281 refers to the acquired information and determines a secondary electron emission number at each emission angle from the incidence angle in the primary electron incidence conditions.

In addition, the simulation program 281 acquires information corresponding to primary electron incidence energy and a sample material at the incidence point 302 from the secondary electron energy distribution information 274. The simulation program 281 refers to the acquired information and determines a secondary electron emission number at each energy from the incidence angle in the primary electron incidence conditions.

The simulation program 281 determines a secondary electron emission number in each set of a secondary electron emission angle and secondary electron energy, from a secondary electron emission number at each secondary electron emission angle and a secondary electron emission number at each secondary electron energy.

Next, as illustrated in FIGS. 4A and 4B, the case in which the penetration region 301 has a shape change on the sample surface will be described. The secondary electron 106 generated by the primary electron 102 incident on the incidence point 302 is affected by the configuration in the penetration region 301. In an example of FIG. 4A, the secondary electron emission number is affected by the region of the sample surface region 152, in addition to the region of the sample surface region 151 including the incidence point 302.

Here, an incidence angle $\theta\_iA=0°$ of the primary electron 102 for the surface region 151 and an incidence angle $\theta\_iB=30°$ of the primary electron 102 for the surface region 151 are assumed. An emission number $Y\_k$ of secondary electrons in which a secondary electron emission angle $\theta\_SE$ is k can be represented by the following formula (2), for example.

[Math. 2]

$$Y\_k = \frac{R1}{R1+R2}Y\_k0 + \frac{R2}{R1+R2}Y\_k3 \qquad (2)$$

$Y\_k0$ shows a secondary electron emission number in the case in which a secondary electron emission angle $\theta\_SE$ is k and the primary electron incidence angle $\theta\_i$ is 0°, in the secondary electron angle distribution information 273. $Y\_k3$ shows a secondary electron emission number in the case in which a secondary electron emission angle $\theta\_SE$ is k and the primary electron incidence angle $\theta\_i$ is 30°, in the secondary electron angle distribution information 273.

The simulation program 281 can calculate the secondary electron emission number at each of the different secondary electron emission angles, using the formula (2). The simulation program 281 can calculate the secondary electron emission number at each of the different secondary electron energies, using the same formula as the formula (2).

The simulation program 281 calculates the secondary electron emission number at each secondary electron emission angle, according to the formula (2), from the secondary electron angle distribution information 273 and the configuration information of the penetration region 301. In addition, the simulation program 281 calculates the secondary electron emission number at each secondary electron energy, according to the same formula as the formula (2), from the secondary electron energy distribution information 274 and the configuration information of the penetration region 301.

The simulation program 281 determines a secondary electron emission number in each set of the secondary electron emission angle and the secondary electron energy, from the secondary electron emission number at each secondary electron emission angle and the secondary electron emission number at each secondary electron energy.

Because the secondary electron emission number in the plane vertical to the normal at the incidence point 302 is the same, the simulation program 281 determines a secondary electron emission number in each set of a secondary electron emission direction and secondary electron energy. The secondary electron emission direction is defined by an angle for the normal and an angle in the plane vertical to the normal.

The simulation program 281 may determine a relation of the secondary electron emission angle and the secondary electron emission number and a relation of the secondary electron energy and the secondary electron emission number, on the basis of a ratio of sizes of the surface regions 151 and 152, according to a calculation formula different from the formula (2). For example, the simulation program 281 may use a ratio of areas of the surface regions 151 and 152.

Next, as illustrated in FIGS. 5A and 5B, the case in which the penetration region 301 has a material change will be described. In an example of FIG. 5A, the secondary electron emission number is affected by the region 402, in addition to the region 401 including the incidence point 302. In the examples of FIGS. 5A and 5B, an incidence angle θ_i of the primary electron 102 on each of the regions 401 and 402 is 0°. An emission number Y_k of secondary electrons in which a secondary electron emission angle θ_SE is k can be represented by the following formula (3), for example.

[Math. 3]

$$Y\_k = \frac{R1}{R1+R2} Y\_k0\_M1 + \frac{R2}{R1+R2} Y\_k0\_M2 \quad (3)$$

In the formula (3), Y_k0_M1 shows a secondary electron emission number in the case in which a sample material is M1, a secondary electron emission angle θ_SE is k, and a primary electron incidence angle θ_i is 0°, in the secondary electron angle distribution information 273. Y_k0_M2 shows a secondary electron emission number in the case in which a sample material is M2, a secondary electron emission angle θ_SE is k, and a primary electron incidence angle θ_i is 0°, in the secondary electron angle distribution information 273.

The simulation program 281 can calculate a secondary electron emission number at each of different secondary electron emission angles, using the formula (3). The simulation program 281 can calculate a secondary electron emission number at each of different secondary electron energies, using the same formula as the formula (3).

The simulation program 281 acquires information of each of materials included in the penetration region 301, from the secondary electron angle distribution information 273 and the secondary electron energy distribution information 274.

The simulation program 281 calculates the secondary electron emission number at each secondary electron emission angle, according to the formula (3), from the information acquired from the secondary electron angle distribution information 273 and the configuration information of the penetration region 301. In addition, the simulation program 281 calculates the secondary electron emission number at each secondary electron energy, according to the same formula as the formula (3), from the information acquired from the secondary electron energy distribution information 274 and the configuration information of the penetration region 301.

The simulation program 281 determines a secondary electron emission number in each set of the secondary electron emission angle and the secondary electron energy, from the secondary electron emission number at each secondary electron emission angle and the secondary electron emission number at each secondary electron energy. In addition, the simulation program 281 determines a secondary electron emission number in each set of a secondary electron emission direction and secondary electron energy.

The simulation program 281 may determine a relation of the secondary electron emission angle and the secondary electron emission number and a relation of the secondary electron energy and the secondary electron emission number, on the basis of a ratio of sizes of the regions 401 and 402, according to a calculation formula different from the formula (3). For example, the simulation program 281 may use a ratio of volumes of the regions 401 and 402 and may use a ratio of areas of the surface regions 155 and 156 of the regions 401 and 402.

The secondary electron emission is calculated according to the configuration of the penetration region 301, so that the secondary electron emission in the vicinity of the region where the shape or the material of the sample changes can be simulated with high precision.

Even when the penetration region 301 has three or more regions where shapes or materials are different, the simulation program 281 can calculate the secondary electron emission, on the basis of the ratio of the sizes. For example, when a plurality of regions where both materials and shapes are different are included, an emission number Y of each term in the formula (3) is determined by an incidence angle of the primary electron beam for each region and a material. A coefficient is represented by a ratio of surface areas of the corresponding regions, for example.

Returning to the flowchart of FIG. 2, as described above, in step S104, the secondary electron emission number of each set of the secondary electron emission direction and the secondary electron energy is determined. The simulation program 281 executes steps S105 to S108 for the secondary electron number of each set.

In step S105, the simulation program 281 determines whether secondary electrons having a characteristic of a selected set of the secondary electron emission direction and the secondary electron energy collide with the sample. The surface shape of the sample is not limited to the flat shape. For example, the secondary electrons generated at the bottom of the groove or the hole may collide with the sidewall.

The simulation program 281 geometrically determines presence and absence of collision of the secondary electron 106 with the sample 105, from the coordinates of the emission point of the secondary electron 106, an emission direction of the secondary electron 106 calculated by step S104, and the sample configuration information 271.

As described above, an emission point of the secondary electron 106 is matched with the incidence point 302 of the primary electron 1002. In addition, an emission direction of the secondary electron is specified uniquely by the secondary electron emission angle θ_SE for the normal at the incidence point 302 and the emission angle φ in the plane vertical to the normal.

When the secondary electron 106 does not collide with the sample 105 (S105: NO), the simulation program 281 determines that the secondary electron emission number of the set of the secondary electron emission direction and the secondary electron energy is detected by the detector 107 and selects a next set of a secondary electron emission direction and secondary electron energy. When operations of all sets end, the simulation program 281 proceeds to step S109.

When the secondary electron 106 collides with the sample 105 (S105: YES), the simulation program 281 proceeds to step S106. In step S106, the simulation program 281 determines whether the energy E_SE of the secondary electron colliding with the sample 105 is less than predetermined threshold energy E_TH. The threshold E_TH is 50 eV, for example, and may be set to any value by the user.

When the energy E_SE of the secondary electron is equal to or more than the energy E_SE of the secondary electron (S106: NO), the simulation program 281 returns to step S102 and executes steps after step S102, for the secondary electron of the set of the secondary electron emission direction and the secondary electron energy. That is, the simulation program 281 calculates a secondary electron emission number at a re-incidence point.

In step S106, the energy E_SE of the secondary electron is less than the energy E_SE of the secondary electron (S106: YES), the simulation program 281 determines that the secondary electron 106 is reflected and proceeds to step S107.

Figures 8A, 8B:
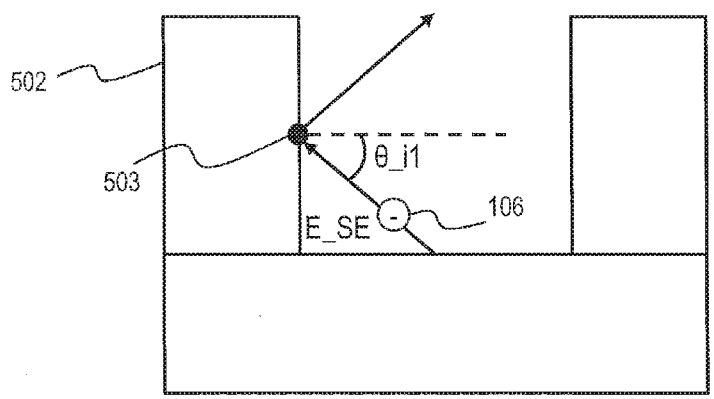
FIG. 8A illustrates a part of information included in reflectance information.
FIG. 8B illustrates an example of the case in which secondary electrons are incident on incidence points of a wall.

In step S107, the simulation program 281 calculates a reflection amount of the secondary electrons colliding with the sample 105, using the reflectance information 275. FIG. 8A illustrates a part of information included in the reflectance information 275. The reflectance information 275 illustrates a relation of an incidence angle θ_i1 of electrons, energy E_SE of the electrons, and reflectance M for each of different materials. The reflectance information 275 may store values acquired experimentally by the user in actuality or may store values described in documents.

FIG. 8B illustrates an example of the case in which the secondary electron 106 is incident on the incidence point 503 of the wall 502. The incidence angle θ_i1 of the secondary electron 106 is defined by an angle for the normal at the incidence point 503. An incidence angle and a reflection angle are the same.

The simulation program 281 determines the incidence angle for the sample 105, from the sample configuration information 271 and the secondary electron emission direction. The simulation program 281 refers to the reflectance information 275 and determines reflectance from the determined incidence angle and secondary electron energy. The simulation program 281 determines a reflected secondary electron number from the secondary electron emission number of the set of the secondary electron emission direction and the secondary electron energy and the reflectance.

In step S108, the simulation program 281 determines whether the reflected electrons further collide with the sample 105. A determination method is the same as step S105. When the reflected electrons further collide with the sample 105 (S108: YES), the simulation program 281 returns to step S107.

When the reflected electrons do not further collide with the sample 105 (S108: NO), the simulation program 281 determines that the reflected electron number is detected by the detector 107 and selects a next set of a secondary electron emission direction and secondary electron energy. When operations of all sets end, the simulation program 281 proceeds to step S109.

In step S109, the simulation program 281 determines whether a simulation of the secondary electron emission is completed for all radiation points (incidence points) in a simulation region. When there remains a radiation point where the simulation is not executed (S109: NO), the simulation program 281 selects a next radiation point and returns to step S102. When simulations of all radiation points are completed (S109: YES), the simulation program 281 ends this flow.

By the above flow, the simulation image generation unit 260 calculates an emission number of secondary electrons finally emitted from each position of the sample. That is, the simulation image generation unit 260 can form a simulation image. In addition, radiation condition optimization of primary electrons using the simulation image can be realized in short time.

In this embodiment, the secondary electron emission number is calculated by referring to management information in which the penetration region of the primary electrons and the emission characteristic and the reflection characteristic of the secondary electrons are stored. Therefore, calculation time can be greatly reduced as compared with the Monte Carlo calculation. By performing calculation in consideration of the penetration region of the primary electrons, a high-precision simulation in the vicinity of a region where a sample shape or material changes can be realized.

According to a specification of the sample configuration or the simulation, the simulation program 281 may not calculate reflection of the secondary electrons by the sample. The secondary electron angle distribution information 273 and the secondary electron energy distribution information 274 may have only information of a single material and may not show information of a relation of an incidence angle and an emission number.

The above example includes the secondary electron angle distribution information 273 and the secondary electron energy distribution information 274 as the emission electron number information. However, when reflection is not calculated, the emission electron number information may show only the emission electron number for the incidence conditions and may not show the angle distribution or the energy distribution.

Second Embodiment

Figure 9:
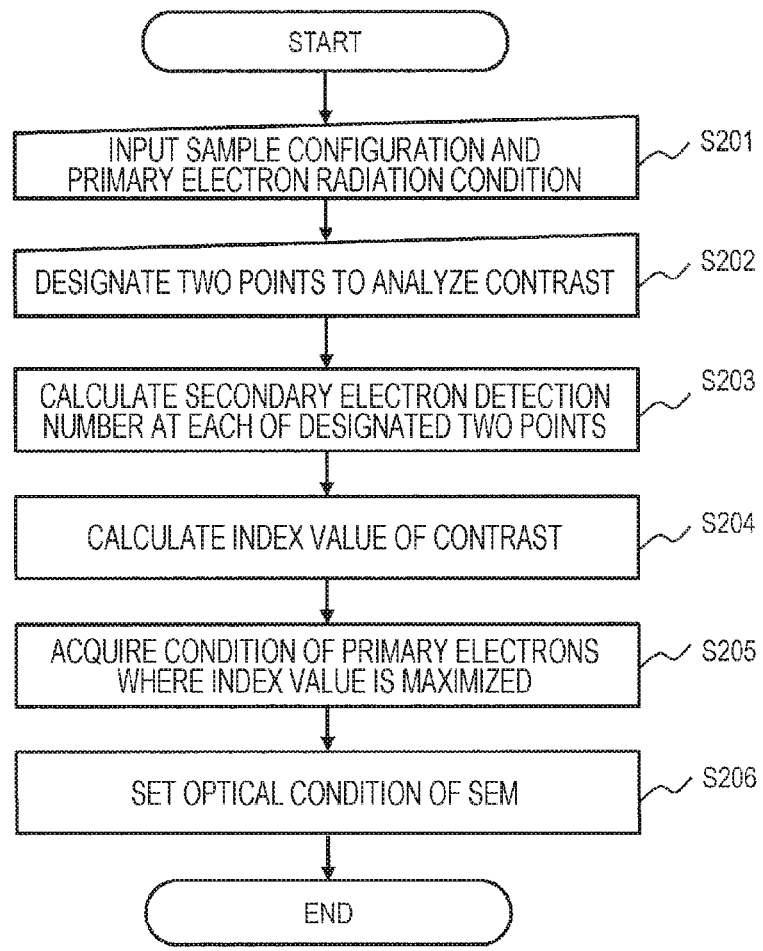
FIG. 9 illustrates a flowchart of radiation condition optimization.

This embodiment shows a method of automatically optimizing radiation conditions of primary electrons. FIG. 9 illustrates a flowchart of radiation condition optimization. Automatic optimization of FIG. 9 acquires radiation conditions where contrast is maximized.

In step S201, a user inputs configuration information of a sample 105 to be a simulation object and a plurality of primary electron radiation conditions from an input device 263. An information management program 282 stores the input configuration information of the sample 105 in sample configuration information 271. The primary electron radiation conditions are stored in a memory 262.

The configuration information of the sample 105 includes three-dimensional information for a shape and a material of the sample 105. The primary electron radiation conditions include energy of primary electrons 102 and an incidence angle for a reference surface of the sample 105. A plurality of different primary electron radiation conditions are input.

Figure 10:
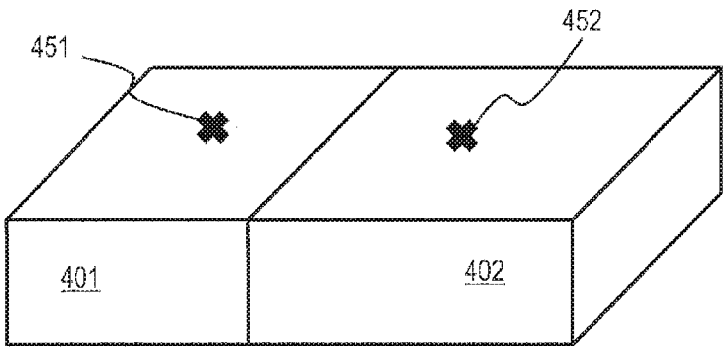
FIG. 10 illustrates an example of two analysis points to analyze contrast.

In step S202, the user designates two analysis points to analyze contrast on the sample 105 from the input device 263. FIG. 10 illustrates an example of the designated two analysis points. In FIG. 10, an analysis point 451 on a region 401 made of a material A and an analysis point 452 on a region 402 made of a material B are designated. The user may select analysis points where surface shapes are different.

In step S203, a simulation program 281 calculates detection numbers YA and YB of secondary electrons generated by radiating the primary electrons to the analysis points 451 and 452 under each of the primary electron radiation conditions, according to the flowchart illustrated in FIG. 2.

Next, in step S204, the simulation program 281 calculates an index value IC of contrast under each primary electron radiation condition, using the detection number YA and the detection number YB under each primary electron radiation condition. The index value IC is represented by the following formula (4), for example.

[Math. 4]

$$IC = \frac{YA - YB}{YA + YB} \quad (4)$$

The index value IC of the contrast may include a difference of the secondary electron detection numbers YA and YB and may be represented by other formula.

Figure 11:
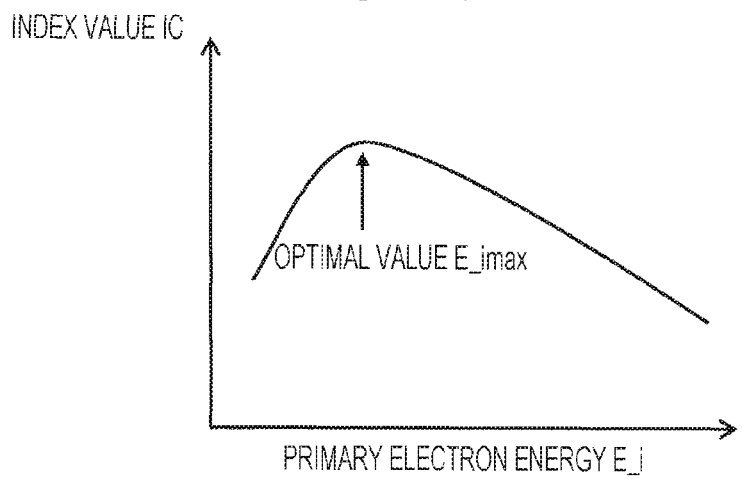
FIG. 11 illustrates an example of a relation of an index value IC and primary electron energy E_i.

In step S205, the simulation program 281 determines a primary electron radiation condition where the index value IC is maximized. FIG. 11 illustrates an example of a relation of the index value IC and primary electron energy E_i. Radiation energy of the primary electrons where the index value IC is maximized is set to E_imax.

Finally, in step S206, the simulation program 281 commands an SEM control unit 200 to set the radiation energy of the primary electrons to Eimax. The SEM control unit 200 sets radiation energy of an electron source 101 to Eimax.

In a scanning image by a scanning electron microscope, brightness at an edge of the sample or an interface of different kinds of materials preferably changes rapidly more than contrast. For example, in an SEM-type length measurement device, a scanning image in which brightness changes rapidly at a pattern edge is preferable.

Figure 12:
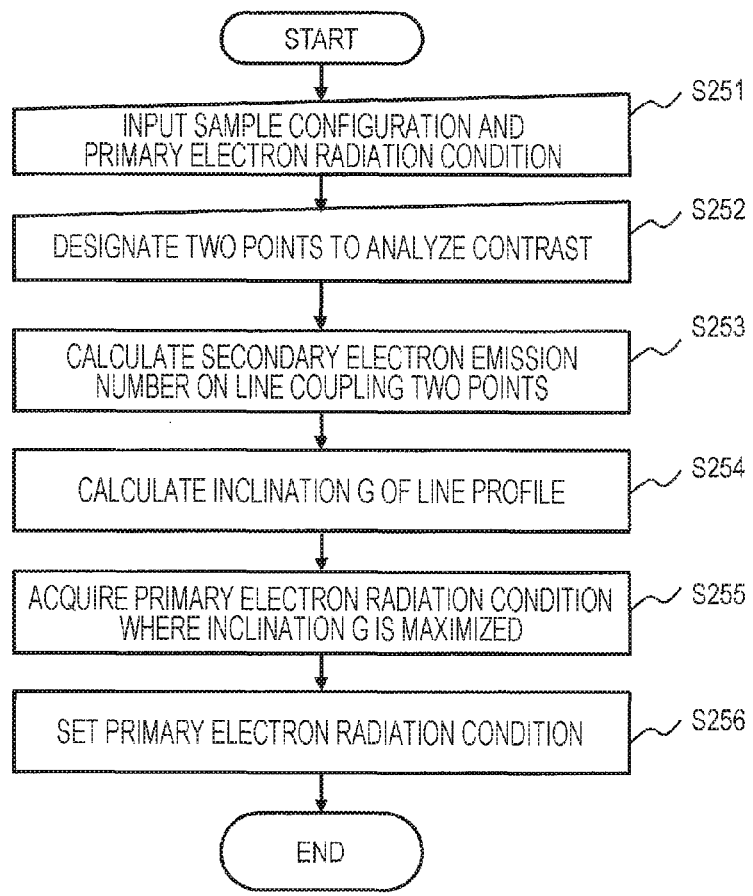
FIG. 12 illustrates a flowchart to determine a primary electron radiation condition where brightness in a scanning image rapidly changes.

FIG. 12 illustrates a flowchart to determine primary electron radiation conditions where brightness in a scanning image changes rapidly. Steps S251, S252, and S256 are the same as steps S201, S202, and S206 of FIG. 9.

In step S253, the simulation program 281 calculates a secondary electron detection number on a line coupling the analysis points 451 and 452 designated by step S202, using the flow described in FIG. 2, and generates a line profile from the analysis point 451 to the analysis point 452. The line profile shows a secondary electron detection number at each point from the analysis point 451 to the analysis point 452.

Figure 13:
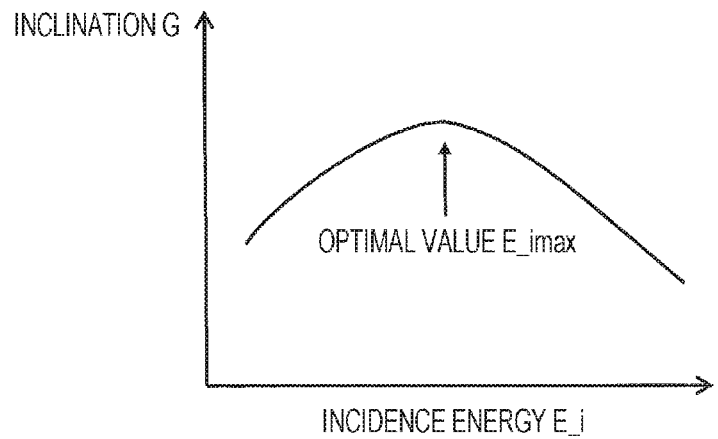
FIG. 13 illustrates an example of a relation of an inclination G and incidence energy E_i.

In step S254, the simulation program 281 acquires a maximum inclination G in the line profile generated by step S253. In step S255, the simulation program 281 determines a radiation condition of the primary electrons in which the inclination G is maximized. FIG. 13 illustrates an example of a relation of the inclination G and the primary electron energy E_i. The radiation energy of the primary electrons in which the inclination G is maximized is set to E_imax.

By the primary electron radiation condition optimization method according to this embodiment, appropriate primary electron radiation conditions can be set in the scanning electron microscope without causing the user to observer the sample actually.

Examples of FIGS. 11 and 13 illustrate simulation results of different primary electron radiation conditions having different primary electron energies. The simulation program 281 may execute simulations of a plurality of primary electron radiation conditions having different radiation angles of primary electrons, instead of or in addition to the primary electron energies. For example, the simulation program 281 commands the angle of the sample stage 108 corresponding to the determined radiation angle for the SEM control unit 200. The SEM control unit 200 controls a movement mechanism 109 and sets a sample stage angle to a designated optimal value.

Third Embodiment

Figure 14:
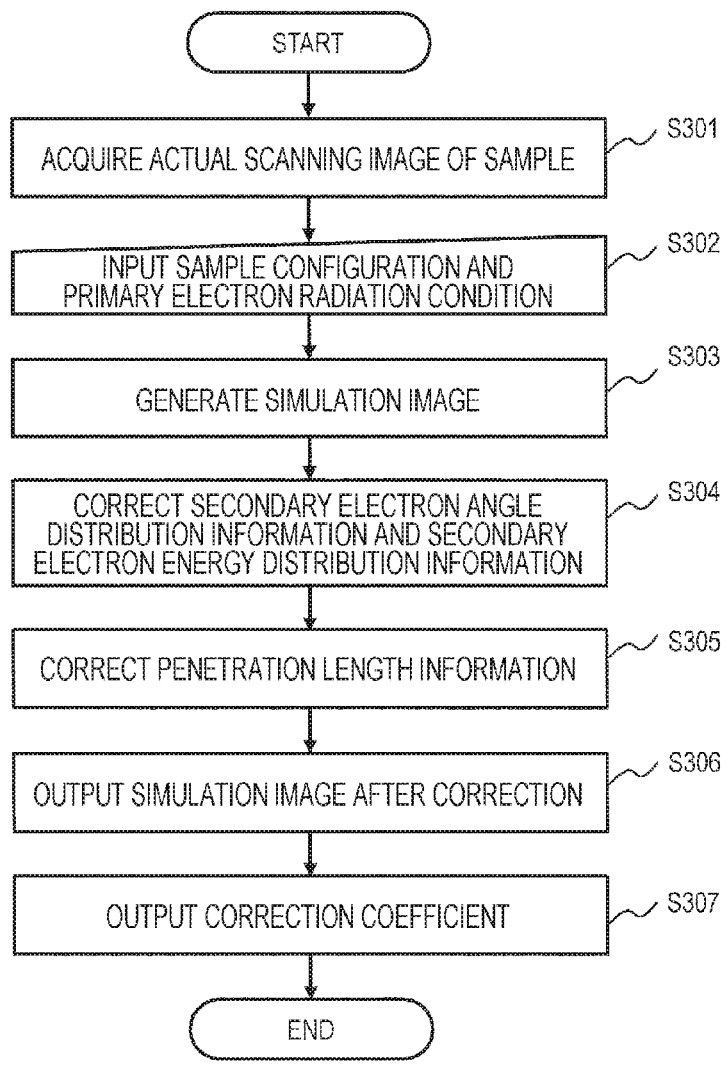
FIG. 14 illustrates a flowchart of a correction method of penetration length information, secondary electron angle distribution information, and secondary electron energy distribution information.

This embodiment illustrates a method of correcting information stored in penetration length information 272, secondary electron angle distribution information 273, and secondary electron energy distribution information 274, on the basis of an actual scanning image obtained by a scanning electron microscope. FIG. 14 illustrates a flowchart of a method of correcting the penetration length information 272, the secondary electron angle distribution information 273, and the secondary electron energy distribution information 274.

In step S301, an information correction program 283 acquires an actual scanning image of an actual sample under a specific primary electron radiation condition. For example, an SEM control unit 200 generates an actual scanning image according to an operation from a user and stores the scanning image in a memory 202. The information correction program 283 acquires the actual scanning image from the memory 202, according to a command from the user, and stores the actual scanning image in a memory 262.

Next, in step S302, the user inputs configuration information of the actual sample in step S301 and the primary electron radiation condition, from an input device 263. The information correction program 283 stores the input information in the memory 262.

In step S303, the simulation program 281 generates a simulation image under the sample configuration and the primary electron radiation condition input by step S302. The information correction program 283 or the user commands the simulation program 281 to generate a simulation operation image.

In step S304, the information correction program 283 corrects the secondary electron angle distribution information 273 and the secondary electron energy distribution information 274, from a difference of the actual scanning image acquired by step S301 and the simulation image generated by step S303.

Figure 15:
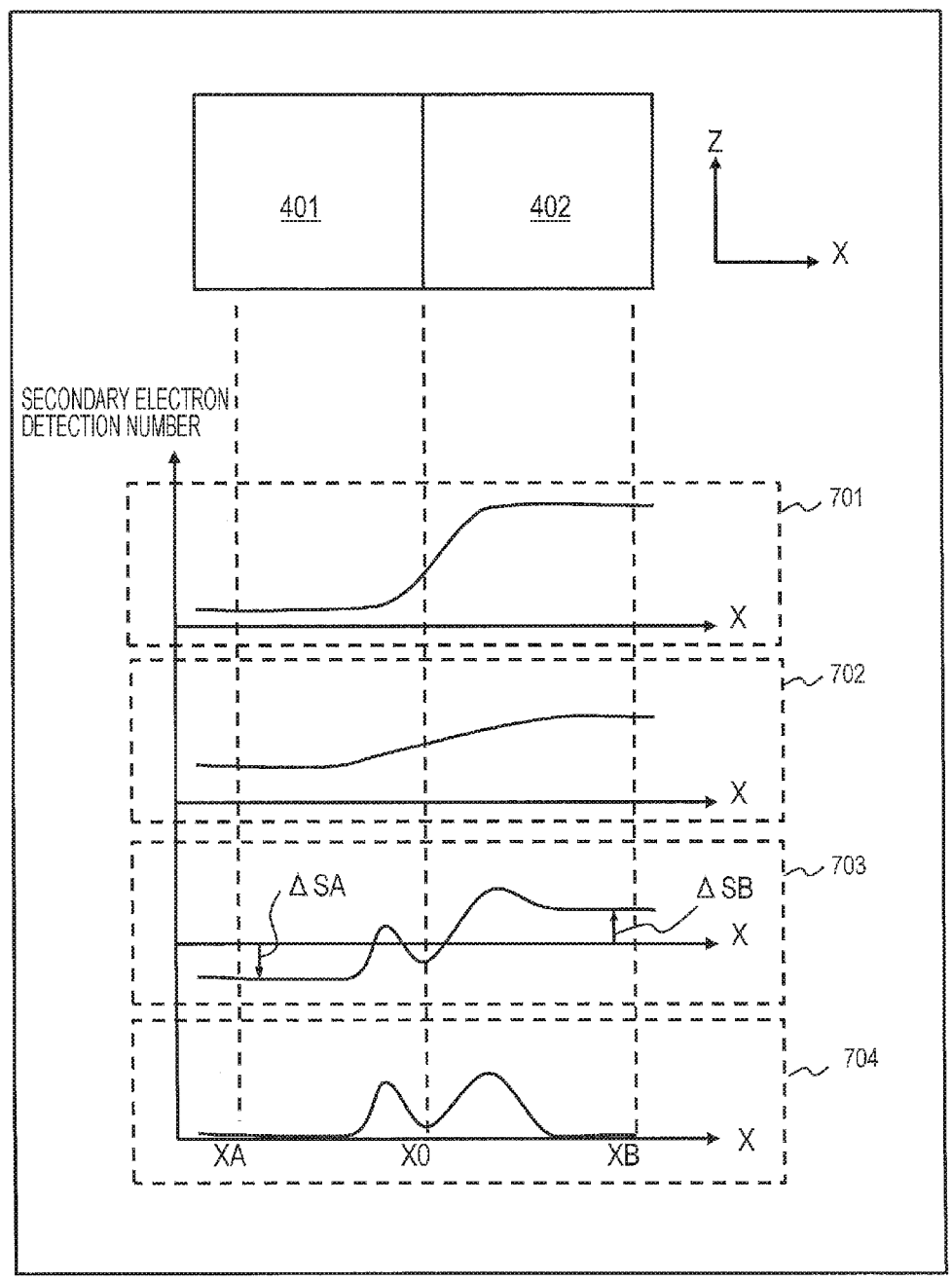
FIG. 15 illustrates a region configuration example and a change of a line profile of a detected secondary electron number to describe information correction.

One example will be described. FIG. 15 illustrates a configuration example of a region to be described below and a change of a line profile of a detected secondary electron number. Hereinafter, as illustrated in FIG. 15, an example of a region where a region 401 of a material A and a region 402 of a material B are joined to be flattened will be described.

In FIG. 15, a graph 701 shows a line profile of an X direction in actual scanning images of the regions 401 and 402. The line profile shows a detection number of secondary electrons generated by radiating primary electrons to each point on a line. A graph 702 shows a line profile of the X direction in simulation images of the regions 401 and 402. A graph 703 shows a difference of the graph 701 and the graph 702.

The information correction program 283 selects points XA and XB sufficiently farther than a joining point X0 of the region 401 and the region 402. In one example, a distance between the point X0 and the point XA and a distance between the point X0 and the point XB are equal to or more than a penetration length R and in other example, the distances are equal to or more than twice the penetration length R. The distance from the point X0 is equal to or more than the penetration length R, so that it is possible to avoid an influence of other material region in simulations of secondary electrons emitted from the points XA and XB.

The information correction program 283 calculates a difference ΔSA of the actual scanning image and the simulation image at the point XA. The information correction program 283 calculates a difference ΔSB of the actual scanning image and the simulation image at the point XB.

In addition, the information correction program 283 acquires information regarding the material A of the region 401 and information regarding the material B of the region 401, from the secondary electron angle distribution information 273 and the secondary electron energy distribution information 274.

The information correction program 283 multiplies each secondary electron emission number with a coefficient BA and corrects the information regarding the material A. For example, the information correction program 283 multiplies each Y with the coefficient BA in the tables of FIGS. 6A and 7A.

Figure 16:
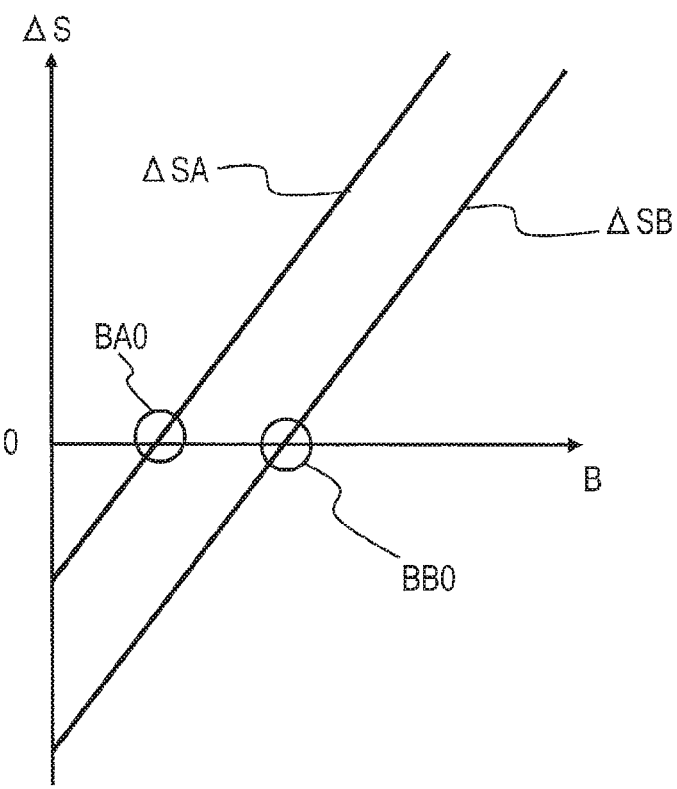
FIG. 16 illustrates graphs of ΔSA and ΔSB.

The information correction program 283 calculates ΔSA between a simulation operation image by the corrected information and the actual scanning image. The information correction program 283 changes the coefficient BA and specifies a relation of the coefficients BA and ΔSA. In the graph of FIG. 16, a line of ΔSA shows a relation of ΔSA and the coefficient BA. The information correction program 283 adopts a value BA0 of the coefficient BA where ΔSA becomes 0 as a correction coefficient of the material A.

Likewise, the information correction program 283 multiplies each secondary electron emission number with a coefficient BB and corrects the information regarding the material B. The information correction program 283 calculates ΔSB between a simulation operation image by the corrected information and the actual scanning image. The information correction program 283 changes the coefficient BB and specifies a relation of the coefficients BB and ΔSB. In the graph of FIG. 16, a line of ΔSB shows a relation of ΔSB and the coefficient BB. The information correction program 283 adopts a value BB0 of the coefficient BB where ΔSB becomes 0 as a correction coefficient of the material B.

As described above, in the correction of the secondary electron angle distribution information and the secondary electron energy distribution information of the specific material, a correction coefficient can be determined from a difference of the brightness (secondary electron detection number) in the actual scanning image at the point of the region of the specific material and the brightness (secondary electron detection number) in the simulation image, without using a line profile.

In step S305, the information correction program 283 corrects the penetration length information 272. The information correction program 283 generates a simulation image using the secondary electron angle distribution information 273 and the secondary electron energy distribution information 274 corrected by correction coefficients BA0 and BB0 acquired by step S304. The information correction program 283 calculates a difference ΔS of the generated simulation image and the actual scanning image. A graph 704 shows ΔS at each point from XA to XB.

The information correction program 283 calculates a value ΔISA obtained by integrating ΔS in a range from XA to X0 and a value ΔISB obtained by integrating ΔS in a range from X0 to XB, according to the following formula (5), and uses the values as index values to correct the penetration length information 272.

[Math. 5]

$$\Delta ISA = \int_{X_A}^{X_C} \Delta S dx, \Delta ISB = \int_{X_B}^{X_C} \Delta S dx \quad (5)$$

The information correction program 283 acquires the information regarding the material A and the information regarding the material B, from the penetration length information 272.

Figure 17:
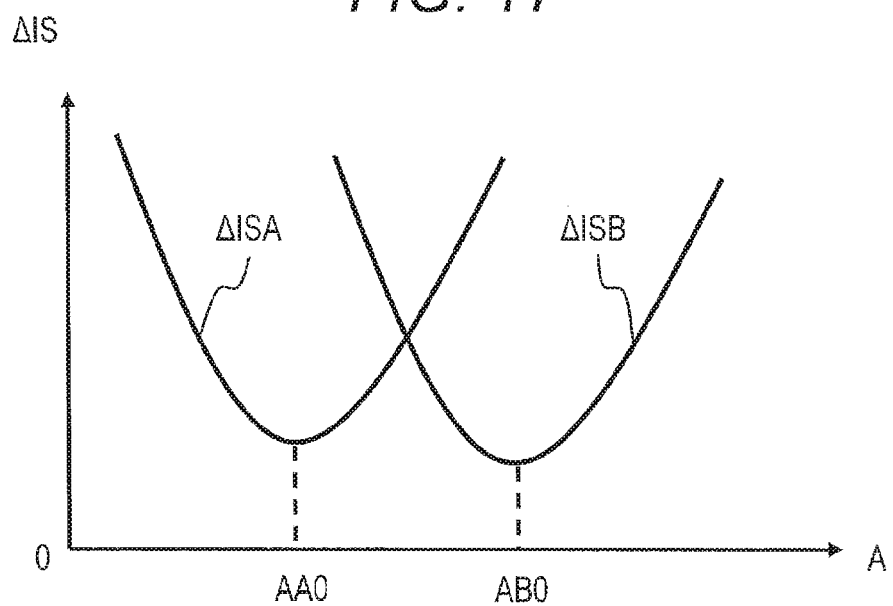
FIG. 17 illustrates graphs of ΔISA and ΔISB.

The information correction program 283 multiplies each secondary electron emission number with a coefficient AA and corrects the information regarding the material A. The information correction program 283 calculates ΔISA between a simulation operation image by the corrected information and the actual scanning image. The information correction program 283 changes the coefficient AA and specifies a relation of the coefficients AA and ΔISA. In the graph of FIG. 17, a line of ΔISA shows a relation of the coefficients AA and ΔISA. The information correction program 283 adopts a value AA0 of the coefficient AA where ΔISA is minimized as a correction coefficient of the material A.

Likewise, the information correction program 283 multiplies each secondary electron emission number with a coefficient AB and corrects the information regarding the material B. The information correction program 283 calculates ΔISB between a simulation operation image by the corrected information and the actual scanning image. The information correction program 283 changes the coefficient AB and specifies a relation of the coefficients AB and ΔISB. In the graph of FIG. 17, a line of ΔISB shows a relation of the coefficients BB and ΔISB. The information correction program 283 adopts a value AB0 of the coefficient AB where ΔISB is minimized as a correction coefficient of the material B.

In step S306, the simulation program 281 displays simulation images simulated using the correction coefficients AA0, AB0, BA0, and BB0. The simulation program 281 may generate and display simulation images using the correction coefficients AA0, AB0, BA0, and BB0 designated to any values by the user. In step S307, the information correction program 283 displays the correction coefficients AA0, AB0, BA0, and BB0.

By a method disclosed in this embodiment, the penetration length information 272, the secondary electron angle distribution information 273, and the secondary electron energy distribution information 274 can be corrected from the actual scanning image. As a result, simulation precision of the simulation image is improved.

In this embodiment, the case in which the regions made of the different materials are used has been described. However, the information can be corrected by the same method using regions having different surface shapes. In addition, the correction coefficients may be determined such that a difference of the actual scanning image and the simulation image decreases and a method of correcting the correction coefficients is not limited to the method disclosed in this embodiment. Only a part of the penetration length information 272, the secondary electron angle distribution information 273, and the secondary electron energy distribution information 274 may be corrected.

The present invention is not limited to the embodiments described above and various modifications are included in the present invention. For example, the embodiments are described in detail to facilitate the description of the present invention and are not limited to embodiments in which all of the described configurations are included. In addition, a part of the configurations of the certain embodiment can be replaced by the configurations of another embodiment or the configurations of another embodiment can be added to the configurations of the certain embodiment. In addition, for a part of the configurations of the individual embodiments, addition, deletion, and replacement of other configurations are enabled.

In addition, a part or all of the individual configurations, functions, and processing units may be designed by integrated circuits and may be realized by hardware. In addition, the individual configurations and functions may be realized by software by analyzing programs for realizing the individual functions by a processor and executing the programs by the processor. Information such as the programs for realizing the individual functions, the tables, and the files may be stored in a recording device such as a memory, a hard disk, and a solid state drive (SSD) or a recording medium such as an IC card and an SD card. In addition, only control lines or information lines necessary for explanation are illustrated and the control lines or information lines do not mean all control lines or information lines necessary for a product. In actuality, almost all configurations may be connected mutually.

The invention claimed is:

1. A charged particle beam device for scanning a sample with charged particles, detecting electrons generated by the charged particles, and forming a scanning image, the charged particle beam device comprising:
   a chamber;
   a charged particle source which radiates a charged particle beam to the sample disposed in the chamber;
   a detector which detects the electrons from the sample;
   a control unit which generates a scanning image on the basis of a detection result by the detector and displays the scanning image; and
   a simulation image generation unit which calculates a detection number of the electrons generated by the charged particles radiated to the sample by a simulation and generates a simulation image of the sample,
   wherein
   the simulation image generation unit holds penetration length information in which incidence conditions of the charged particles and a penetration length are associated with each other, sample configuration information showing a configuration of the sample, and emission electron number information in which the incidence conditions of the charged particles and an emission electron number are associated with each other,
   the number of electrons emitted from a predetermined incidence point is calculated on the basis of incidence conditions at the predetermined incidence point, the penetration length information, the sample configuration information, and the emission electron number information, and
   in calculation of a detection number of electrons generated by the charged particles incident on a first incidence point of the sample
      a first incidence condition of the charged particles at the first incidence point is determined on the basis of radiation conditions of the charged particles and the sample configuration information,
      a spherical penetration region centered at the first incidence point is determined on the basis of the first incidence condition and having a radius defined by the penetration length information,
      a sample configuration in the penetration region is specified on the basis of the sample configuration information, and
      the number of electrons emitted from the first incidence point is calculated on the basis of the first incidence condition, the sample configuration in the penetration region, and the emission electron number information.

2. The charged particle beam device according to claim 1, wherein
   the incidence conditions in the penetration length information include charged particle energy and a sample material, and
   the incidence conditions in the emission electron number information include an incidence angle, the charged particle energy, and the sample material.

3. The charged particle beam device according to claim 2, further comprising:
   reflectance information that shows a relation of the incidence conditions of the electrons in the sample and reflectance,
   wherein the emission electron number information shows a relation of the incidence conditions of the charged particles and an electron emission angle distribution and a relation of the incidence conditions of the charged particles and an electron energy distribution, and
   the simulation image generation unit determines the number of electrons at each of different energies to be emitted from the first incidence point in a first emission direction, on the basis of the emission electron number information, determines whether the electrons emitted from the first incidence point in the first emission direction are incident on the sample again, on the basis of the sample configuration information, determines a sample incidence angle of the electrons in the first emission direction, on the basis of the first emission direction and the sample configuration information, when the electrons in the first emission direction are incident on the sample again, determines reflectance of the electrons at each of the different energies, on the basis of the incidence angle and the reflectance information, and determines a reflection number of electrons at each of the different energies from the reflectance and the number of electrons at each of the different energies in the first emission direction.

4. The charged particle beam device according to claim 1, wherein
   the simulation image generation unit determines incidence conditions for each of partial regions of different configurations in the penetration region, on the basis of the radiation conditions and the sample configuration information, determines the number of electrons emitted from a point of each of the partial regions, on the basis of the incidence conditions for each of the partial regions and the emission electron number information, and determines the number of electrons emitted from the first incidence point, on the basis of the number of electrons emitted from the point of each of the partial regions.

5. The charged particle beam device according to claim 4, wherein
   the simulation image generation unit determines the number of electrons emitted from the first incidence point, on the basis of the number of electrons emitted from the point of each of the partial regions and a ratio of surface sizes of the partial regions.

6. The charged particle beam device according to claim 1, wherein
   the simulation image generation unit generates a plurality of simulation images under different radiation conditions, calculates an index value of contrast based on electron detection numbers of two analysis points in each of the plurality of simulation images, and determines radiation conditions in actual observation of the sample, on the basis of the index value.

7. The charged particle beam device according to claim 1, wherein
the simulation image generation unit generates a plurality of simulation images under different radiation conditions, calculates an inclination of a line profile on the same line of the sample in each of the plurality of simulation images, and determines radiation conditions in actual observation of the sample, on the basis of the inclination.

8. The charged particle beam device according to claim 1, wherein
the simulation image generation unit corrects at least one of the penetration length information and the emission electron number information, on the basis of a comparison result of an actual scanning image of the sample and a plurality of simulation images under different radiation conditions.

9. The charged particle beam device according to claim 8, wherein
the simulation image generation unit corrects the emission electron number information, on the basis of a brightness difference of a first analysis point of the sample between the actual scanning image and each of the plurality of simulation images.

10. The charged particle beam device according to claim 8, wherein
the simulation image generation unit corrects the penetration length information, on the basis of a difference of line profiles from a first analysis point in a first region of the sample to a boundary with a second region having a configuration different from a configuration of the first region, between the actual scanning image and each of the plurality of simulation images.

11. A simulation method for calculating a detection number of electrons generated by charged particles radiated to a sample in a charged particle beam device by a simulation, the simulation method comprising:
determining a first incidence condition of the charged particles at a first incidence point of the sample, on the basis of radiation conditions of the charged particles from a charged particle source and sample configuration information showing a configuration of the sample;
determining a spherical penetration region centered at the first incidence point is determined on the basis of the first incidence condition and having a radius defined by the penetration length information, incidence conditions of the charged particles and a penetration length being associated with each other;
specifying a sample configuration in the penetration region, on the basis of the sample configuration information; and
determining the number of electrons emitted from the first incidence point, on the basis of the first incidence condition, the sample configuration in the penetration region, and emission electron number information in which the incidence conditions of the charged particles and an emission electron number are associated with each other.

12. A simulation device for calculating a detection number of electrons generated by charged particles radiated to a sample by a simulation and generating a simulation image of the sample, comprising:
a simulation image generation unit which calculates a detection number of the electrons generated by the charged particles radiated to the sample by a simulation and generates a simulation image of the sample, wherein
penetration length information in which incidence conditions of the charged particles and a penetration length are associated with each other, sample configuration information showing a configuration of the sample, and emission electron number information in which the incidence conditions of the charged particles and an emission electron number are associated with each other are held,
the number of electrons emitted from a predetermined incidence point is calculated on the basis of incidence conditions at the predetermined incidence point, the penetration length information, the sample configuration information, and the emission electron number information, and
in calculation of a detection number of electrons generated by the charged particles incident on a first incidence point of the sample
a first incidence condition of the charged particles at the first incidence point is determined on the basis of radiation conditions of the charged particles and the sample configuration information,
a spherical penetration region centered at the first incidence point is determined on the basis of the first incidence condition and having a radius defined by the penetration length information,
a sample configuration in the penetration region is specified on the basis of the sample configuration information, and
the number of electrons emitted from the first incidence point is calculated on the basis of the first incidence condition, the sample configuration in the penetration region, and the emission electron number information.

13. The simulation device according to claim 12, wherein
the incidence conditions in the penetration length information include charged particle energy and a sample material, and
the incidence conditions in the emission electron number information include an incidence angle, the charged particle energy, and a sample material.

* * * * *